(12) United States Patent
Chesavage

(10) Patent No.: US 6,239,626 B1
(45) Date of Patent: May 29, 2001

(54) GLITCH-FREE CLOCK SELECTOR

(75) Inventor: Jay A. Chesavage, Palo Alto, CA (US)

(73) Assignee: Cisco Technology, Inc.

( * ) Notice: Subject to any disclaimer, the term of this patent is extended or adjusted under 35 U.S.C. 154(b) by 0 days.

(21) Appl. No.: 09/479,030

(22) Filed: Jan. 7, 2000

(51) Int. Cl.[7] .................................................. H03K 17/00
(52) U.S. Cl. ........................... 327/99; 327/166; 327/298; 327/407; 327/147
(58) Field of Search .................................. 327/99, 18, 20, 327/165, 166, 198, 298, 407, 147

(56) References Cited

U.S. PATENT DOCUMENTS

| | | |
|---|---|---|
| 4,229,699 | 10/1980 | Frissell . |
| 4,855,616 | 8/1989 | Wang et al. . |
| 4,970,405 | 11/1990 | Hagiwara . |
| 5,099,140 | 3/1992 | Mudgett . |
| 5,260,979 | 11/1993 | Parker et al. . |
| 5,274,678 | 12/1993 | Ferolito et al. . |
| 5,289,138 | 2/1994 | Wang . |
| 5,315,181 | 5/1994 | Schowe . |
| 5,448,597 | 9/1995 | Hashimoto . |
| 5,502,409 | 3/1996 | Schnizlein et al. . |
| 5,502,819 | 3/1996 | Alderich et al. . |
| 5,553,231 | 9/1996 | Papenberg et al. . |
| 5,586,307 | 12/1996 | Wong et al. . |
| 6,128,359 | * 10/2000 | Volk ..................................... 375/371 |

FOREIGN PATENT DOCUMENTS

| | | | |
|---|---|---|---|
| 59041925 | * 3/1984 | (JP) ........................................ 327/99 |
| 01189220 | * 7/1989 | (JP) ........................................ 327/99 |
| 05268020 | * 10/1993 | (JP) ........................................ 327/99 |

* cited by examiner

Primary Examiner—Terry D. Cunningham
Assistant Examiner—Quan Tra
(74) Attorney, Agent, or Firm—Jay A. Chesavage

(57) ABSTRACT

A pair of synchronized clock sources provides phase and frequency synchronous first and second clocks accompanied by first and second control signals to a clock selection circuit having a data selector comprising a first synchronizer and a second synchronizer which re-times the first and second control signals, and these re-timed outputs that are coupled to an asynchronous state machine. The asynchronous state machine changes state by logically operating on the re-timed control signals in conjunction with a state bit. This state bit is used to control the multiplexer, which achieves glitch-free switching between the first clock source and the second clock source.

32 Claims, 5 Drawing Sheets

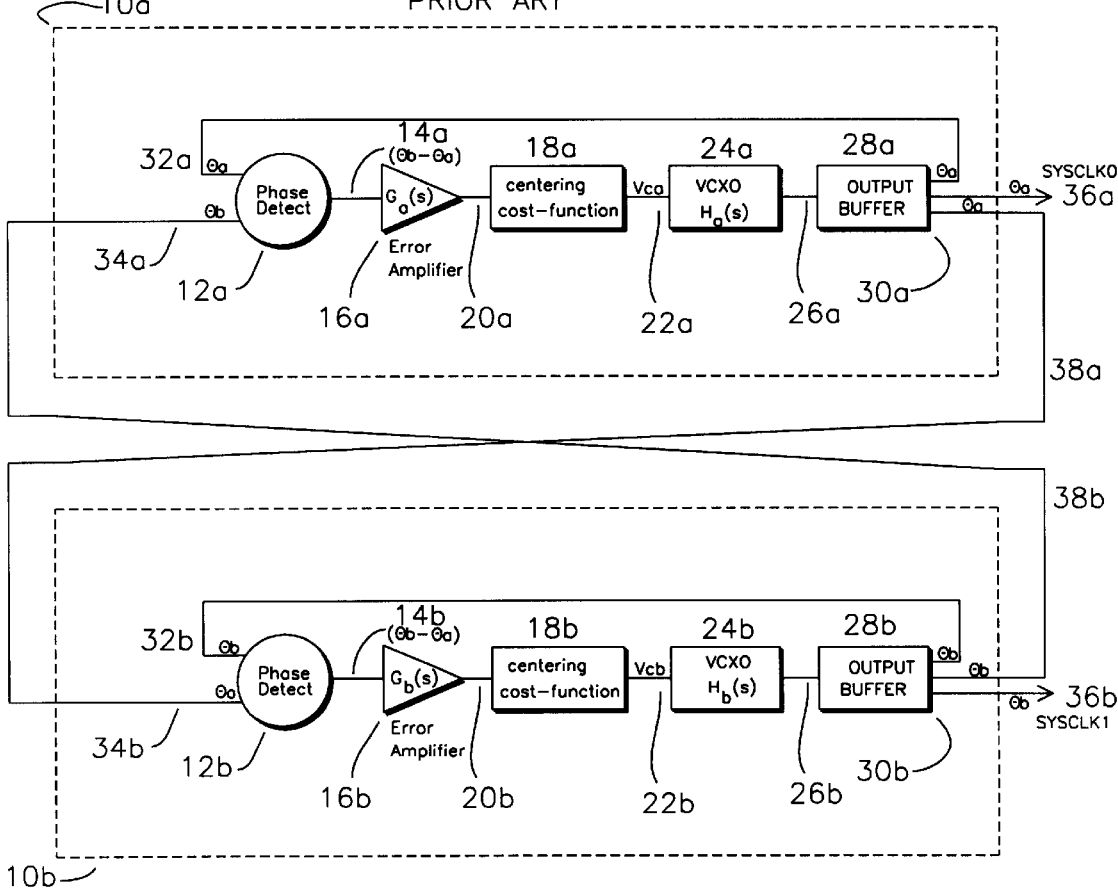
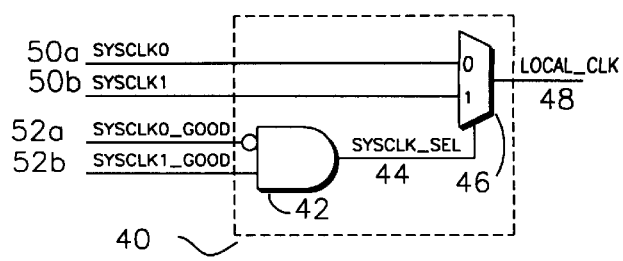

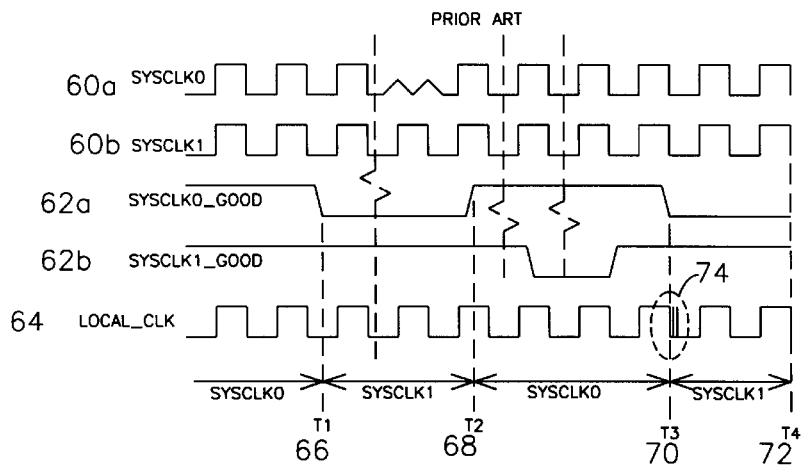
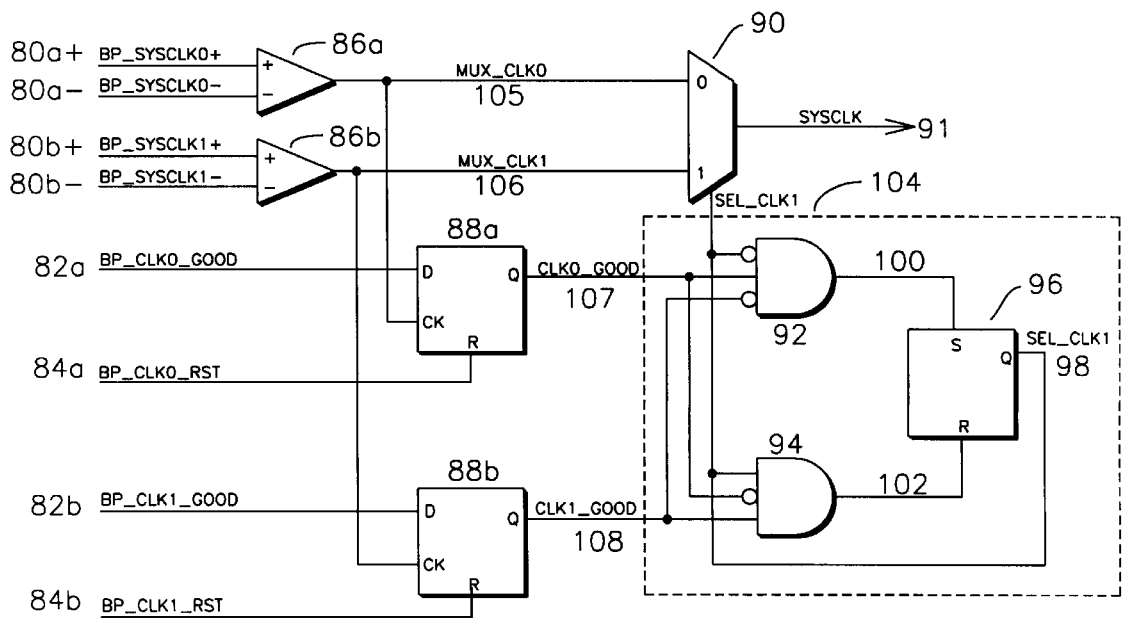

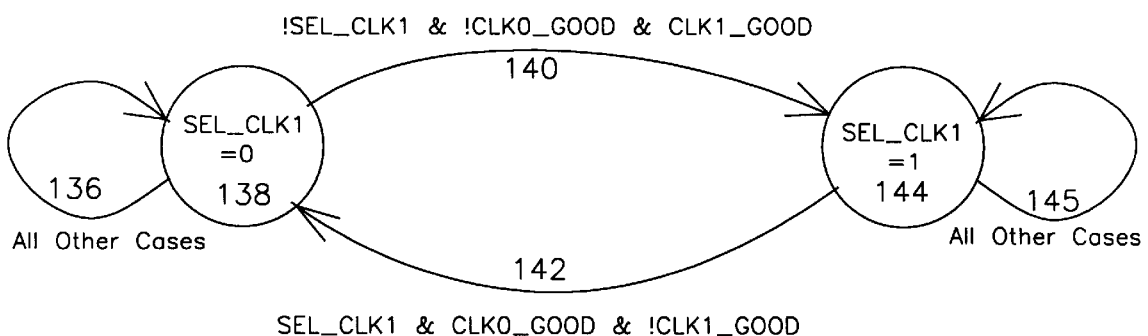
Figure 5: Selection State Machine
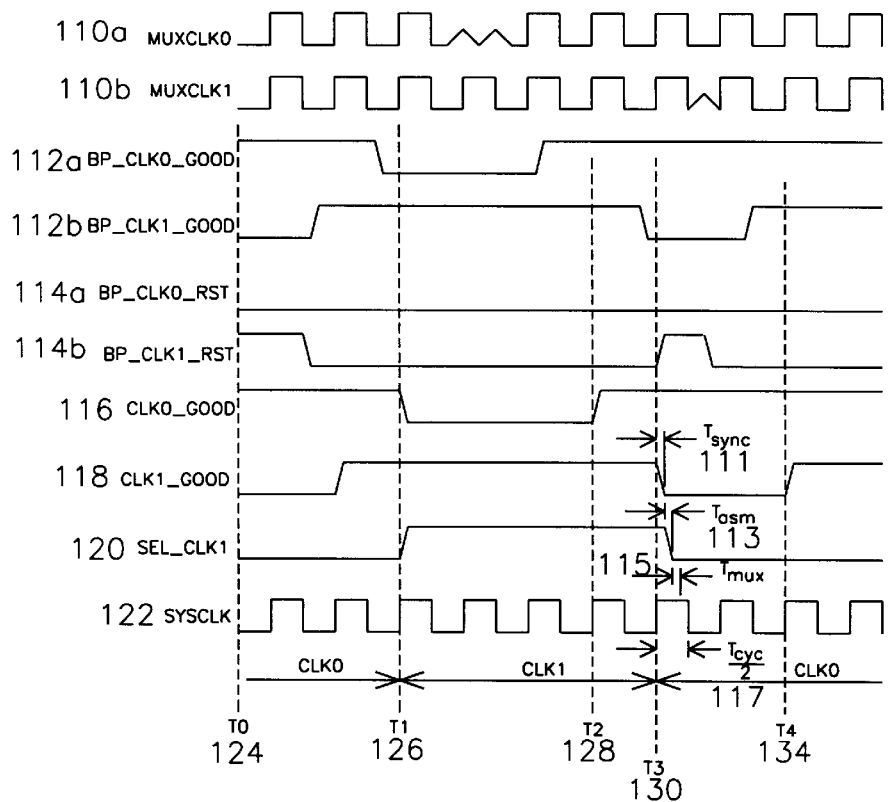
Figure 6: Select Timing

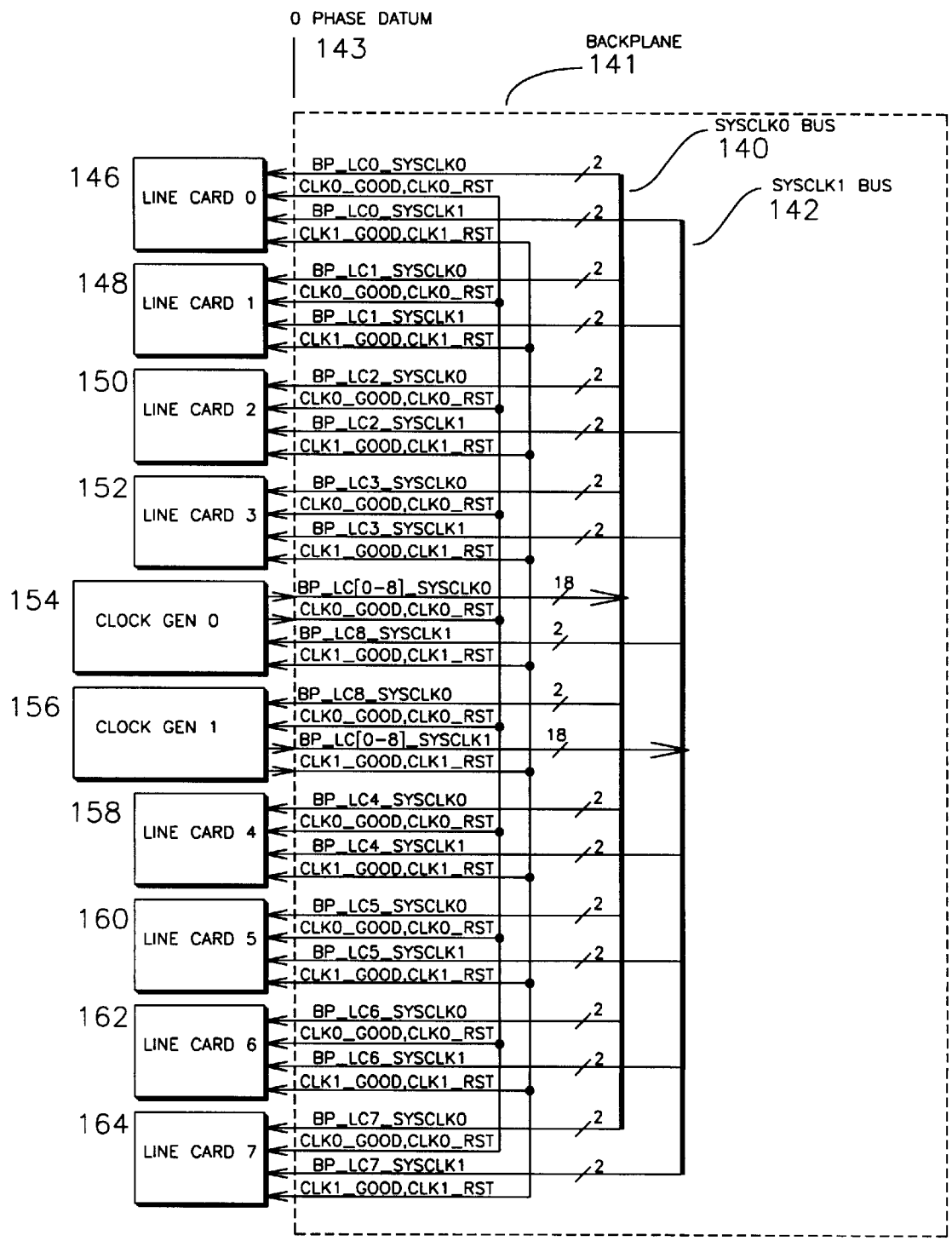
Figure 7: System Clock Distribution

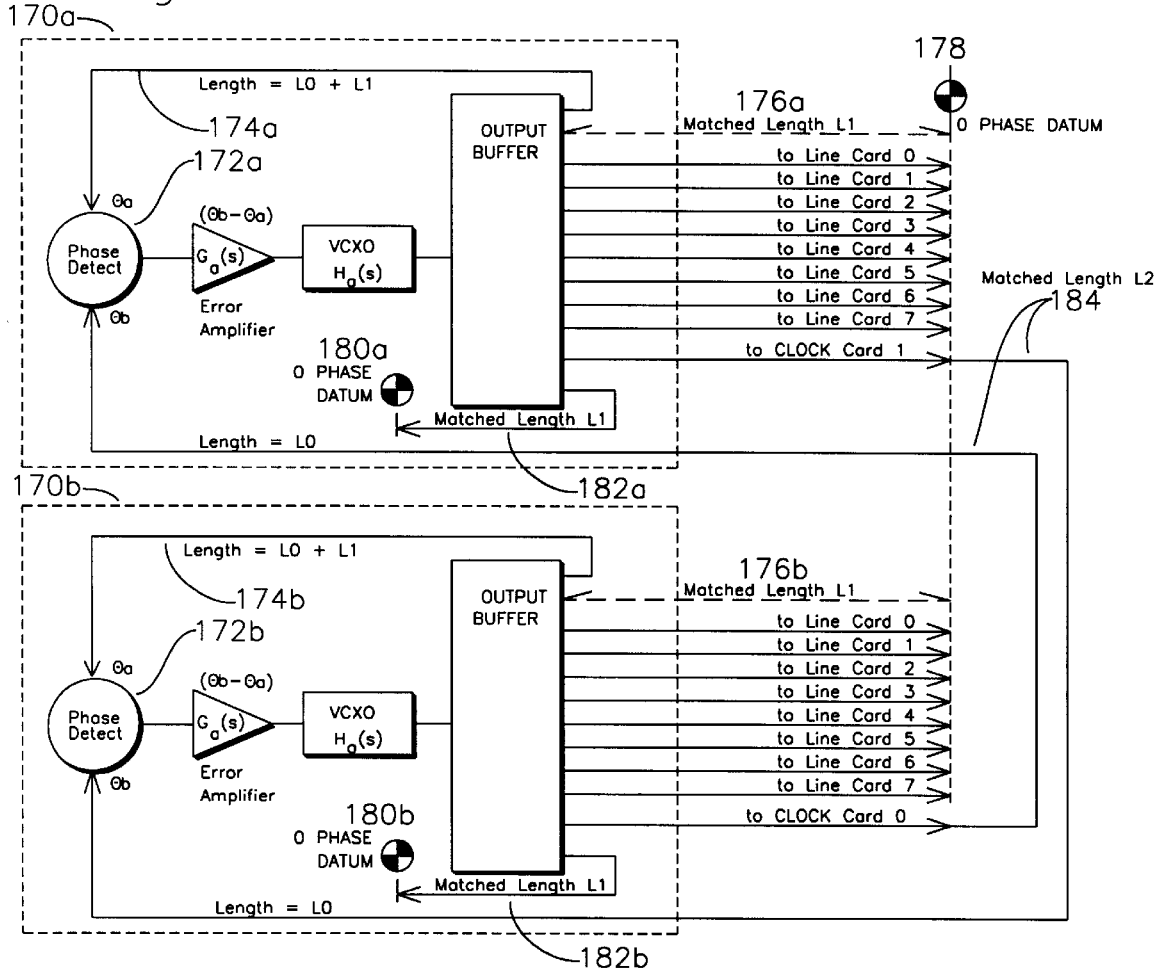
Figure 8: CLOCK GENERATOR
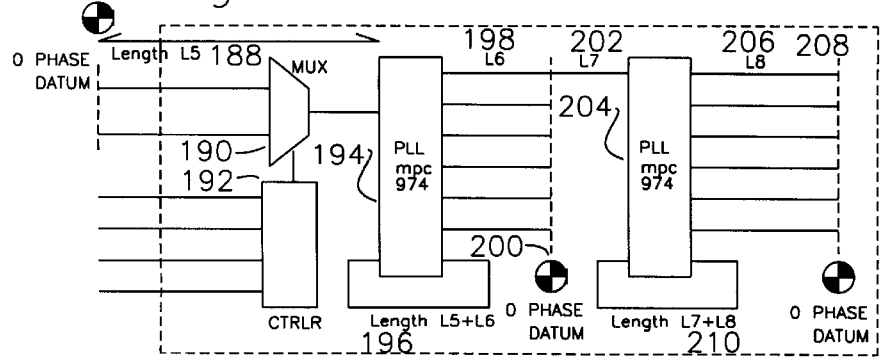
Figure 9: Line Card Clock Distribution ial application Ser. No. 09/332,204 by Chesavage. A first clock
GLITCH-FREE CLOCK SELECTOR

FIELD OF THE INVENTION

The current invention is directed to an apparatus for selecting a clock from among a plurality of phase and frequency synchronized clocks in a manner which provides a glitch-free clock source to all system components consuming such clock.

BACKGROUND OF THE INVENTION

In a high-availability system, there is often an architecture whereby some of the subsystems are in use, and some of the subsystems are provided as a backup to the subsystems that are in use. In this configuration, the subsystems that are in use are referred to as ACTIVE, and the subsystems that are for backup purposes are referred to as STANDBY. In such systems, there is a need to provide a distributed method for the delivery of clocking such that an ACTIVE subsystem that may be sourcing a clock to the entire system can be instantaneously switched over to a subsystem that was previously STANDBY, and now takes over as an ACTIVE system. There is typically a requirement that the clock selection be handled by each subsystem which consumes a system clock, and during the switchover, the clock source that is delivered must be glitch-free. Glitch-free clock transition is required in modern electronic systems because a low frequency clock such as 25 Mhz is typically distributed, and thereafter multiplied with phase lock loops (PLLs) up to frequencies as high as 300 Mhz. Since each clock frequency is typically produced by a different PLL on a single subsystem, and each subsystem is expected to retain synchronism, it is a system requirement that the transition from one system clock to another be phase and frequency coherent. When a PLL encounters an extra input transition, or "glitch", the PLL will rapidly increase in frequency, then slow back down to track the system frequency. During this interval, synchronization between the present PLL and the other system PLLs is lost, and this causes data transfers from one clock domain to another to be unreliable.

One prior art system involves selecting a clock between two clock sources, and then following the selected clock with a PLL to smooth out edge discontinuities and glitches that may have occurred during the clock source transition. One such system is described in U.S. Pat. No. 5,260,979 by Parker et al. This type of system works well where there is a single decision point which produces the system clock used by the rest of the system. In applications where the decision point resides on each system card, it is not possible to assure that all of the independent PLLs will track each other at the time of a phase transition following a clock switchover event.

Another prior art system involves the use of three clock oscillators, which self-synchronize to the fastest oscillator and thereafter distribute this signal to the other parts of the system, as described in U.S. Pat. No. 5,553,231. With this system, when the fastest oscillator is removed, the system frequency quickly changes to a slower frequency.

The system of U.S. Pat. No. 5,502,819 generates two asynchronous clocks and distributes each to a clock select circuit which does not change clock selections until the current clock cycle is complete. U.S. Pat. Nos. 4,970,405 and 5,099,140 both similarly blank the new clock until a full cycle of the old clock has completed. This prevents glitches at the point of switchover, but provides for an instantaneous frequency change, since the two clock sources are not locked to each other. Similarly, U.S. Pat. No. 5,502,409 describes a clock selector which synchronizes a "clock switch" signal to the latter-occurring of the two system clocks before switching to the alternate source. U.S. Pat. No. 5,315,181 describes a circuit for selecting between two clocks whereby the select line is synchronized to an output clock formed from a first and second clock. In this system, if the selected input clock were to fail in the 0 or 1 level, the output clock would stop, and the select line would have no further effect.

OBJECTS OF THE INVENTION

It is desired to have a clock selection circuit which selects between two frequency and phase locked sources without producing output transients. A first object of the invention is the glitch-free selection of a clock source from among a plurality of frequency-locked or phase-locked clocks. A second object of the invention is the selection from a first clock to a second clock in a phase synchronous, frequency synchronous manner. A third object of the invention is a non-revertive clock selection circuit whereby the selection of an active clock is unchanged until the active clock becomes bad while the standby clock is good.

SUMMARY OF THE INVENTION

A plurality of phase and frequency synchronized clock signals are provided to a multiplexer controlled by one or more asynchronous control lines, which are re-timed by a synchronizer with a response time $T_{syNc}$. The multiplexer is controlled by a clock select input, which is generated by the output of an asynchronous state machine. The asynchronous state machine comprises a Set Reset (SR) flip flop which produces this clock select bit. The set input of the flip flop is controlled by a logic function that is only asserted when the currently selected clock is bad and the standby clock is indicated to be good, and the reset input is controlled by a logic function that is only asserted when the currently selected clock is bad and the standby is indicated to be good. The propagation time from a control input of the multiplexer to the output is $T_{mux}$, while the propagation time from a control input to the asynchronous state machine output is $T_{prop}$. These propagation times are constrained to be $T_{prop}+T_{mux}+T_{asm}<=T_{clk}/2$, where $T_{clk}$ is the period of the system clock.

BRIEF DESCRIPTION OF THE DRAWINGS

FIG. 1 is a block diagram of a prior art cross-coupled clock generator.

FIG. 2 is the schematic diagram of a prior art clock selector.

FIG. 3 is a timing diagram for the prior art circuit of FIG. 2.

FIG. 4 is the schematic diagram for a glitch-free clock selector.

FIG. 5 is a state diagram for FIG. 4.

FIG. 6 is a timing diagram for the circuit of FIG. 4.

FIG. 7 is a block diagram showing system clock distribution.

FIG. 8 is the block diagram for the clock generator of FIG. 7.

FIG. 9 is a schematic diagram for the line card of FIG. 8.

DETAILED DESCRIPTION OF THE INVENTION

FIG. 1 shows a prior art cross coupled clock generator of application Ser. No. 09/332,204 by Chesavage. A first clock generator 10a and a second clock generator 10b have cross-connected outputs 38a and 38b. The block diagram will be described from the perspective of the first clock generator, since the first and second clock generators are identical. A phase detector 12a compares the phase difference between a local clock 32a and the remote clock 34a. An error signal proportional to the phase difference between these inputs is developed at output 14a and is delivered to an error amplifier 16a, which produces an output signal 20a which drives a centering cost function 18a, and provides a weighting function to steer the voltage controlled crystal oscillator (VCXO) 24a to a center frequency. The VCXO 24a drives an output buffer 30a which provides the local copy 32a of the output signal, as well as multiple copies of this signal as a system clock 36a, and a remote copy as output 38a to the remote clock generator 10b. In operation, clock generators 10a and 10b produce phase and frequency synchronized outputs 36a and 36b.

FIG. 2 is a prior art clock select circuit. A multiplexer 46 is driven by SYSCLK0 and SYSCLK1, and SYSCLK_SEL 44 is generated by an AND gate 42 which uses the control signals SYSCLK0_GOOD and SYSCLK1_GOOD to switch SYSCLK1 if SYSCLK1 is good and SYSCLK0 is bad, and selects SYSCLK0 at all other times. Typically, SYSCLKn_GOOD indications are provided by the clock control circuit, which indicates the state of the clock circuit, and is provided to assert and unassert these signals when the circuitry providing the active clock is to be moved to standby prior to servicing the unit providing this clock.

FIG. 3 shows the timing diagram for the circuit of FIG. 2. SYSCLK0 60a and SYSCLK1 60b are provided by the cross-coupled oscillator, as described earlier. SYSCLK0_GOOD 62a and SYSCLK1_GOOD 62b are asserted as shown in the time intervals described. At T1 66, SYSCLK0_GOOD is unasserted, indicating that SYSCLK0 will stop operating, or become invalid soon. The multiplexer responds asynchronously to this command as T1 66, switching the clock selector to SYSCLK1, as shown. At the time T2 68, SYSCLK0_GOOD is asserted, and the MUX now selects SYSCLK0, as shown. Note that in this model of revertive switching, this change was unnecessary, as SYSCLK1 could have continued providing this clock. At time T3 70, SYSCLK0_GOOD is unasserted, and this change is illustrated to occur coincident with the transition of SYSCLK0 50a and SYSCLK1 50b, producing the race condition shown as the glitches of 74. The genesis of this race condition is the multiplexer fed by a plurality of coincidentally changing signals, in this case SYSCLK0 50a, SYSCLK1 50b, and the multiplexer select signal SYSCLK_SEL 44. The glitches 74 have a catastrophic effect on subsequent phase lock loops, as the loop accumulates phase error as if the loop fell out of lock with a maximum phase error during this one cycle.

FIG. 4 shows the schematic diagram of the present invention. $BP_{13}SYSCLK0\pm$ 80a± and $BP_{13}SYSCLK1\pm$ 80b± are provided as differential backplane signals to differential receivers 86a and 86b, which translate these signals into MUX_CLK0 105 and MUX_CLK1 106, respectively. Associated with each SYSCLKn are a pair of control signals BP_CLKn_GOOD 82a and 82b, and BP_CLKn_RST 84a and 84b, which collectively indicate the status of the associated clock. When BP_CLKn_RST 84a or 84b is asserted, the subsystem circuitry sourcing the clock is in reset, as is normally associated with a power-up reset event. BP_CLKn_GOOD is asserted when the circuitry providing the clock signal SYSCLKn has passed self test, and the two clocks are locked to each other. Ordinarily, the BP_CLKn_GOOD signal is used to coordinate the removal of the clock board from the system. When a card is to be removed from a system, a short pin on the backplane breaks contact prior to any other signal pin and sends a signal which is de-bounced, and then passed along to all of the other cards in the system as BP_CLK0_GOOD and BP_CLK1_GOOD. BP_CLKn_GOOD is also controlled by the local processor in the system, which enables the signal to be asserted administratively prior to the replacement of a CPU which may also contain the clock circuitry. In this manner, the clock makes an orderly and glitch-free transition from one source to the other, and may be done administratively by explicit request, or automatically upon removal of the card providing it. The two clock signals MUX_CLK0 105 and MUX_CLK1 106 are provided to a multiplexer 90, which provides the selected SYSCLK 91, which is provided to the circuitry on the card requiring a system clock signal. The subsystem generating the BP_SYSCLKn also provides associated control information about the desirability of using that clock through the signals BP_CLKn_GOOD 82a and 82b, and BP_CLKn_RST 84a and 84b. The control signals associated with BP_SYSCLK0 80a, BP_CLK0_GOOD 82a and BP_CLK0_RST 84a are provided to synchronizer 88a, which provides a synchronized signal CLK0_GOOD 107, and the same processing is provided for the control signals associated with BP_SYSCLK1 80b, BP_CLK1_GOOD 82b and BP_CLK1_RST 84b, which provide a re-timed CLK1_GOOD 108, using the synchronizer 88b. The synchronized CLK0_GOOD 107 and CLK1_GOOD 108 signals are applied to asynchronous state machine 104, which provides an output SEL_CLK1 98, which is the state bit in the preferred embodiment. Asynchronous state machine 104 comprises a SR flip flop 96, a SET gate 92 controlling the SET input 100 of the flip flop 96, having as inputs the state bit SEL_CLK 98, and CLK0_GOOD 107, and CLK1_GOOD 108. There is also a RESET gate 94 which controls the reset input 102 of flip flop 96. The inputs of the RESET gate are the state bit SEL_CLK1 98, and the re-timed signals CLK0_GOOD 107 and CLK1_GOOD 108. There are many different ways of synthesizing the functions 92 and 94 shown, but for active high signals and active high gates and flip flops, the input equations to the flip flop are:

SET=CLK0_GOOD & !CLK1_GOOD & !SEL_CLK1

RESET=!CLK0_GOOD & CLK1_GOOD & SEL_CLK1

The operation of these equations is shown in the state diagram of FIG. 5. The asynchronous state machine only selects the non-selected clock if it is currently good when the currently selected clock is bad. This is referred to as non-revertive switching, whereby changes in clock selection are minimized by changing the source only when necessary, and not returning to a previously good clock unless the currently selected clock becomes bad. For example, state SEL_CLK1=0 138 indicates that the system is currently selecting CLK0. The only condition for which the state machine switches to CLK1 is transition 140, when CLK0 is bad, and CLK1 is good. Similarly, when CLK1 is selected as shown in state 144, the only path 142 switching back to CLK0 is when CLK0 is good and CLK1 is bad.

FIG. 6 shows the waveforms for the circuit of FIG. 4. The synchronized clocks MUXCLK0 110a and MUXCLK1 110b are accompanied by their control signals BP_CLK0_GOOD 112a, BP_CLK0_RST 114a, and BP_CLK1_GOOD 112b, BP_CLK1_RST 114b. The synchronized signals CLK0_GOOD 116 and CLK1_GOOD 118 respond to changes in the control signals as shown. At time T0 124, CLK0_GOOD is active, and CLK1_GOOD is inactive, as BP_CLK1_RST is asserted, and BP_CLK1_GOOD is inactive until prior to T1 126. At this time, BP_CLK1_GOOD is active and BP_CLK1_RST is inactive, so the present edge of MUXCLK1 110b clocks CLK1_GOOD 116 active. At the same time, MUXCLK0 is about to go down, as declared by BP_CLK0_GOOD 112a becoming unasserted prior to T1 126. This causes path 140 of FIG. 5 to be taken, so SEL_CLK1 120 is asserted high at time T1 126. SYSCLK 122 is now sourced from MUXCLK1 110b, and the noise appearing after T1 126 on MUXCLK0 110a is not seen by the system, and the clock generator for MUXCLK0 110a may be removed from the system. At time T2 128, MUXCLK0 returns to usable state, as evidenced by the reassertion of BP_CLK0_GOOD prior to T2 128. The state machine does not change states, as the existing clock is satisfactory, and the state machine stays in the same state 144, traversing path 145 of FIG. 5. At time T3, BP_CLK1_GOOD is unasserted, and CLK1_GOOD is unasserted. This causes the state machine to traverse path 142 of FIG. 5, returning to state 138. Prior to time T4, BP_CLK1_GOOD is reasserted, causing CLK1_GOOD to be asserted after time T4, however, there is no change in clock source as the existing source CLK0 is still good. The time associated with detecting and delivering this selection before a clock transition is also shown. After an edge (positive or negative) of the MUXCLKn, the resynchronizer delivers CLKnGOOD, shown as $T_{sync}$ 111. This signal is fed to the asynchronous state machine (asm), which produces the SEL_CLK1 signal in $T_{asm}$ 113. The multiplexer takes $T_{mux}$ to respond to this signal, and the next edge occurs in $T_{cyc}/2$. The constraint for glitch-free operation is therefore $T_{sync}+T_{asm}+T_{mux}<=T_{cyc}/2$.

FIG. 7 shows a typical system clock distribution in a backplane system. Line Cards 0 through 7 (146, 148, 150, 152, 158, 160, 162, and 164) plug into backplane 141, and all consume their own copy of BP_LCn_SYSCLK0 produced by Clock Generator 0 154 and a copy of BP_LCn_SYSCLK1 produced by Clock Generator 1 156. The clock cross connects are accomplished by having Clock Generator 0 154 consumes a copy of BP_LC8_SYSCLK1, and Clock Generator 1 156 consume a copy of BP_LC8_SYSCLK0. A set of control signals CLK0_GOOD and CLK0_RST is sent by Clock Generator 0 154 common to all cards as described earlier. Similarly, Clock Generator 1 156 sources control signals CLK1_GOOD and CLK1_RST to all line cards.

FIG. 8 shows the distribution of clock with 0 phase difference between loads. The phase difference between $\Theta a$ and $\Theta b$ of phase detector 172a is negligible. If the lengths of distribution traces 176a are matched, then the phase from $\Theta a$ input of Phase Detector 172 back to the output buffer is $0-(PH_{L0}+PH_{L1})$, and the phase at datum point 178 is $0-(PH_{L0}+PH_{L1})+PH_{L1}=PH_{L0}$. Similarly, the phase working backwards from $\Theta b$ of Phase detector 172a to the output buffer 182b and to the datum point 178 on an output from generator 170b is $0-PH_{L0}-PH_{L1}+PH_{L1}=PH_{L0}$. Following this phase advance and phase retarding to accommodate trace delays on the circuit, we can see that all points marked with the 0 phase datum symbol will have the same clock phase. If the 0 phase datum 178 is chosen to be at the backplane of the system, it is then possible to distribute clocks 180a, 200a, and 208 which have the same phase at the load as the distributed clock at the datum reference of the backplane 178.

FIG. 9 shows the line card clock distribution. At the point the clock is delivered to the phase datum backplane 186, a MUX 190 and controller 192 as described earlier in FIG. 4 deliver a clock signal to a distribution PLL 194 shown in this illustration as Motorola MPC974, manufactured by Motorola Semiconductor of Schaumburg, Ill. By adjusting the feedback trace 196 to be the sum of the electrical delay in delivering the signal from the datum 186 to the PLL input (shown as L5 which includes electronic and propagation delays), and adding this to the length of the output trace L6 198, the resultant phase of a clock at point 200 will be the same as the phase at point 186. Similarly for PLL 204, if the input trace L7 and the output trace L8 are added to the feedback trace 210, the phases at datums 208 and 200 will be the same as the phase at backplane 186.

I claim:

1. A clock selector for selecting between a first and a second clock source, said first and second clock source being phase and frequency synchronous and having a period $T_{cyc}$, said selector comprising:

a multiplexer having a first input for receiving said first clock source, a second input for receiving said second clock source, a control input, and an output, said multiplexer coupling said first input to said output when said control input is inactive, and coupling said second input to said output when said control input is active, said coupling from input to output occurring within a time $T_{mux}$ after said control input changes value;

a first synchronizer coupled to said first clock source and accepting as an input a first clock quality signal, and producing as output a synchronized first clock quality signal within a time $T_{sync1}$ after the occurrence of an edge on said first clock source;

a second synchronizer coupled to said second clock source and accepting as an input a second clock quality signal, and producing as output a synchronized second clock quality signal within a time $T_{syn2}$ after the occurrence of an edge on said second clock source;

an asynchronous state machine (ASM) having a first input, a second input, memory, and an output coupled to said memory, said output changing within a time $T_{asm}$ after application of said input, said ASM output coupled to said multiplexer control input, said ASM first input coupled to said first synchronizer output, said ASM second input coupled to said second synchronizer output, when said memory value is inactive, said memory value changes to active only when said first synchronizer output indicates said first clock quality is bad and said second synchronizer output indicates said second clock quality is good, said memory maintaining an inactive value at all other times, when said memory value is active, said memory value changes to inactive only when said first synchronizer output indicates said first clock quality is good and said second synchronizer output indicates said second clock quality is bad, said memory maintaining an active value at all other times.

2. The selector of claim 1 where $T_{sync1}+T_{mux}+T_{asm}<=\frac{1}{2}(T_{cyc})$.

3. The selector of claim 1 where $T_{sync2}+T_{mux}+T_{asm}<=\frac{1}{2}(T_{cyc})$.

4. The selector of claim 1 where at least one of said first synchronizer first clock source edge or said second synchronizer second clock source edge is a positive edge.

5. The selector of claim 1 where at least one of said first synchronizer first clock source edge or said second synchronizer second clock source edge is a negative edge.

6. The selector of claim 1 where at least one of said first synchronizer or said second synchronizer is a D flip flop.

7. The selector of claim 1 where said memory comprises an RS flip flop.

8. The selector of claim 7 where said RS flip flop has a SET input asserted when the following logical statement is true:

(said memory value) & !(said ASM first input) & (said ASM second input).

9. The selector of claim 7 where said RS flip flop has a SET input asserted when the following logical statement is true:

!(said memory value) & (said ASM first input) & !(said ASM second input).

10. The selector of claim 7 where said RS flip flop has a RESET input asserted when the following logical statement is true:

(said memory value) & !(said ASM first input) & (said ASM second input).

11. The selector of claim 7 where said RS flip flop has a RESET input asserted when the following logical statement is true:

!(said memory value) & (said ASM first input) & !(said ASM second input).

12. The selector of claim 7 where said memory comprises a D flip flop with an asynchronous SET and an asynchronous RESET input.

13. The selector of claim 12 where said D flip flop has a SET input asserted when the following logical statement is true:

(said memory value) & !(said ASM first input) & (said ASM second input).

14. The selector of claim 12 where said D flip flop has a SET input asserted when the following logical statement is true:

!(said memory value) & (said ASM first input) & !(said ASM second input).

15. The selector of claim 12 where said D flip flop has a RESET input asserted when the following logical statement is true:

(said memory value) & !(said ASM first input) & (said ASM second input).

16. The selector of claim 12 where said D flip flop has a RESET input asserted when the following logical statement is true:

!(said memory value) & (said ASM first input) & !(said ASM second input).

17. A redundant clock generator and selector comprising:

a first clock generator having a first variable frequency oscillator source coupled to a first output buffer having a plurality of outputs, each said output having an electrical length L1, said first variable frequency oscillator having an input for varying said frequency, one of said first output buffer output being a first clock source, a second clock generator having a second variable frequency oscillator source coupled to a second output buffer having a plurality of outputs, each said output having an electrical length L1, said second variable frequency oscillator having an input for varying said frequency, one of said second output buffer outputs being a second clock source, a first phase detector having a local input and a remote input and producing an output proportional to the phase error between said local input and said remote input, said first phase detector coupled to a first error amplifier providing an output proportional to said phase error multiplied by a frequency dependent gain, said first error amplifier output coupled to said first variable frequency oscillator input, a second phase detector having a local input and a remote input and producing an output proportional to the phase error between said local input and said remote input, said second phase detector coupled to a second error amplifier providing an output proportional to said phase error multiplied by a frequency dependant gain, said second error amplifier output coupled to said second variable frequency oscillator input, said first phase detector remote input coupled to one of said second output buffer outputs and having an electrical length L0, said first phase detector local input coupled to one of said first output buffer outputs and having an electrical length L0+L1, said second phase detector remote input coupled to one of said first output buffer outputs and having an electrical length L0, said second phase detector local input coupled to one of said second output buffer outputs and having an electrical length L0+L1, a multiplexer having a first input, a second input, a control input, and an output, said multiplexer coupling said first input to said output when said control input is inactive, and coupling said second input to said output when said control input is active, said coupling from input to output occurring within a time $T_{mux}$ after said control input changes value, said multiplexer first input coupled to one of said first output buffer outputs, said multiplexer second input coupled to one of said second output buffer outputs;

a first synchronizer coupled to said first clock source and accepting as an input a first clock quality signal, and producing as output a synchronized first clock quality signal within a time $T_{sync1}$ after the occurrence of an edge on said first clock source;

a second synchronizer coupled to said second clock source and accepting as an input a second clock quality signal, and producing as output a synchronized second clock quality signal within a time $T_{syc2}$ after the occurrence of an edge on said first clock source;

an asynchronous state machine (ASM) having a first input, a second input, memory, and an output coupled to said memory, said output changing within a time $T_{asm}$ after application of said input, said ASM output coupled to said multiplexer control input, said ASM first input coupled to said first synchronizer output, said ASM second input coupled to said second synchronizer output, when said memory value is inactive, said memory value changes to active only when said first synchronizer output indicates said first clock quality is bad and said second synchronizer output indicates said second clock quality is good, said memory maintaining an inactive value at all other times, when said memory value is active, said memory value changes to inactive only when said first synchronizer output indicates said first clock quality is good and said second synchronizer output indicates said second clock quality is bad, said memory maintaining an active value at all other times.

18. The selector of claim 17 where $Ts_{sync1}+T_{mux}+T_{asm} <= \frac{1}{2}(T_{cyc})$.

19. The selector of claim 17 where $T_{sync2}+T_{mux}+T_{asm} <= \frac{1}{2}(T_{cyc})$.

20. The selector of claim 17 where at least one of said first synchronizer first clock source edge or said second synchronizer second clock source edge is a positive edge.

21. The selector of claim 17 where at least one of said first sychronizer first clock source edge or said second synchronizer second clock source edge is a negative edge.

22. The selector of claim 17 where at least one of said first synchronizer or said second synchronizer is a D flip flop.

23. The selector of claim 17 where said memory comprises an RS flip flop.

24. The selector of claim 23 where said RS flip flop has a SET input asserted when the following logical statement is true:

(said memory value) & !(said ASM first input) & (said ASM second input).

25. The selector of claim 23 where said RS flip flop has a SET input asserted when the following logical statement is true:

!(said memory value) & (said ASM first input) & !(said ASM second input).

26. The selector of claim 23 where said RS flip flop has a RESET input asserted when the following logical statement is true:

(said memory value) & !(said ASM first input) & (said ASM second input).

27. The selector of claim 23 where said RS flip flop has a RESET input asserted when the following logical statement is true:

!(said memory value) & (said ASM first input) & !(said ASM second input).

28. The selector of claim 23 where said memory comprises a D flip flop with an asynchronous SET and an asynchronous RESET input.

29. The selector of claim 23 where said D flip flop has a SET input asserted when the following logical statement is true:

(said memory value) & !(said ASM first input) & (said ASM second input).

30. The selector of claim 28 where said D flip flop has a SET input asserted when the following logical statement is true:

!(said memory value) & (said ASM first input) & !(said ASM second input).

31. The selector of claim 28 where said D flip flop has a RESET input asserted when the following logical statement is true:

(said memory value) & !(said ASM first input) & (said ASM second input).

32. The selector of claim 28 where said D flip flop has a RESET input asserted when the following logical statement is true:

!(said memory value) & (said ASM first input) & !(said ASM second input).

* * * * *